(12) United States Patent
Su et al.

(10) Patent No.: US 12,022,270 B2
(45) Date of Patent: Jun. 25, 2024

(54) MEMS MICROPHONE AND PREPARATION METHOD THEREFOR

(71) Applicant: CSMC TECHNOLOGIES FAB2 CO., LTD., Jiangsu (CN)

(72) Inventors: Jiale Su, Jiangsu (CN); Guoping Zhou, Jiangsu (CN); Xinwei Zhang, Jiangsu (CN); Changfeng Xia, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 199 days.

(21) Appl. No.: 17/761,669

(22) PCT Filed: May 26, 2020

(86) PCT No.: PCT/CN2020/092212
§ 371 (c)(1),
(2) Date: Mar. 18, 2022

(87) PCT Pub. No.: WO2021/051854
PCT Pub. Date: Mar. 25, 2021

(65) Prior Publication Data
US 2022/0386052 A1 Dec. 1, 2022

(30) Foreign Application Priority Data

Sep. 18, 2019 (CN) .......................... 201910885581.4

(51) Int. Cl.
*H04R 19/04* (2006.01)
*B81C 1/00* (2006.01)
*H04R 31/00* (2006.01)

(52) U.S. Cl.
CPC ....... *H04R 31/003* (2013.01); *B81C 1/00158* (2013.01); *H04R 19/04* (2013.01);
(Continued)

(58) Field of Classification Search
CPC ........................ H04R 19/005; H04R 2201/003
See application file for complete search history.

(56) References Cited

U.S. PATENT DOCUMENTS 7,190,038 B2 * 3/2007 Dehe .................... B81B 3/0021
257/419
7,834,409 B2 * 11/2010 Reichenbach ........ G01L 9/0073
257/419
(Continued)

FOREIGN PATENT DOCUMENTS

CN  202444620 U  9/2012
CN  103297907 A  9/2013
(Continued)

*Primary Examiner* — Ryan Robinson
(74) *Attorney, Agent, or Firm* — Muncy, Geissler, Olds & Lowe, P.C.

(57) ABSTRACT

A preparation method for a micro-electromechanical systems (MEMS) microphone includes the steps of: providing a silicon substrate having a silicon surface; forming an enclosed cavity in the silicon substrate; forming a plurality of spaced apart acoustic holes in the silicon substrate, each acoustic hole having two openings, one of which communicating with the cavity and the other one located on the silicon surface; forming a sacrificial layer on the silicon substrate, which includes a first filling portion, a second filling portion and a shielding portion; forming a polysilicon layer on the shielding portion; forming a recess in the silicon substrate on the side away from the silicon surface; and removing the first filling portion, the second filling portion and part of the shielding portion so that the recess is brought into communication with the cavity to form a back chamber, and that the polysilicon layer, the remainder of the shielding portion and the silicon substrate together delimit a hollow chamber, the hollow chamber communicating with the opening of the plurality of acoustic holes away from the cavity, completing the MEMS microphone.

19 Claims, 4 Drawing Sheets

(52) U.S. Cl.
CPC ............... *B81C 2201/0105* (2013.01); *B81C 2201/0116* (2013.01); *B81C 2201/0133* (2013.01); *H04R 2201/003* (2013.01)

(56) References Cited

U.S. PATENT DOCUMENTS

| | | | |
|---|---|---|---|
| 8,003,422 B2 * | 8/2011 | Lee | B81C 1/00182 |
| | | | 438/667 |
| 8,796,790 B2 | 8/2014 | Yang | |
| 9,143,870 B2 * | 9/2015 | Liu | H04R 19/04 |
| 9,326,081 B2 * | 4/2016 | Momotani | H04R 19/005 |
| 9,518,884 B2 * | 12/2016 | Tsai | B81B 3/007 |
| 9,676,615 B2 * | 6/2017 | Miao | B81C 1/00158 |
| 2010/0108345 A1 | 5/2010 | Hsu et al. | |
| 2010/0164025 A1 | 7/2010 | Yang | |
| 2012/0090398 A1 | 4/2012 | Lee et al. | |
| 2014/0061868 A1 | 3/2014 | Hiruta | |
| 2015/0060955 A1 * | 3/2015 | Chen | H04R 19/04 |
| | | | 257/254 |
| 2015/0110309 A1 * | 4/2015 | Park | B81B 3/0086 |
| | | | 381/190 |

FOREIGN PATENT DOCUMENTS

| | | |
|---|---|---|
| CN | 203368757 U | 12/2013 |
| CN | 105721997 A | 6/2016 |
| CN | 105792084 A | 7/2016 |
| CN | 105848075 A | 8/2016 |
| CN | 205584497 U | 9/2016 |
| CN | 106954164 A | 7/2017 |
| CN | 107360526 A | 11/2017 |
| CN | 107857233 A | 3/2018 |
| DE | 10 2004 011 145 A1 | 10/2005 |
| JP | 2009264995 A | 11/2009 |
| JP | 2017044543 A | 3/2017 |
| JP | 2019035709 A | 3/2019 |
| KR | 10-2011-0083419 A | 7/2011 |

* cited by examiner

MEMS MICROPHONE AND PREPARATION METHOD THEREFOR

TECHNICAL FIELD

The present invention relates to the field of semiconductor devices, and more particular to a micro-electromechanical systems (MEMS) microphone and a preparation method for the MEMS microphone.

BACKGROUND

Conventional fabrication method for micro-electromechanical systems (MEMS) microphone typically involves the structure of polysilicon layer-sacrificial layer-polysilicon layer. Ever-growing demand for higher performance has led to a sacrificial layer thickness of up to 3 to 4 μm and a baseplate thickness of up to 2 to 3 μm. These in turn lead to a large step thickness, which imposes very stringent requirements on photolithography and etching, challenging the fabrication.

SUMMARY OF THE INVENTION

In view of this, it is necessary to provide a method for fabricating an MEMS microphone that can reduce the difficulty of the process.

An MEMS microphone is also provided.

A preparation method for an MEMS microphone includes the steps of:

providing a silicon substrate having a silicon surface;

forming an enclosed cavity in the silicon substrate;

forming a plurality of spaced apart acoustic holes in the silicon substrate, each open both into the cavity and on the silicon surface of the silicon substrate;

forming a sacrificial layer on the silicon substrate, which includes a first filling portion filling the cavity, a second filling portion filling the acoustic holes and a shielding portion shielding the silicon surface of the silicon substrate;

forming a polysilicon layer on the side of the shielding portion away from the silicon surface;

forming a recess in the silicon substrate on the side away from the silicon surface; and removing the first filling portion, the second filling portion and part of the shielding portion of the sacrificial layer so that the recess is brought into communication with the cavity, resulting in the formation of a back chamber, and that the polysilicon layer, the remainder of the shielding portion and the silicon substrate together delimit a hollow chamber, into which the acoustic holes are open on the side away from the cavity, completing the MEMS microphone.

An MEMS microphone includes a silicon substrate, a support member and a polysilicon layer, the silicon substrate having a silicon surface, the silicon substrate formed therein with a back chamber and a plurality of spaced apart acoustic holes each open both on the silicon surface and into the back chamber, the support member arranged on the silicon surface, the polysilicon layer disposed on the support member so as to be spaced apart from the silicon substrate so that the silicon substrate, the support member and the polysilicon layer together delimit a hollow chamber into which the acoustic holes are open on the side away from the back chamber.

Details of one or more embodiments of the present invention are set forth in the following drawings and detailed description. Other features, objects and advantages of the present invention will become apparent from the description, drawing and claims.

BRIEF DESCRIPTION OF THE DRAWINGS

In order to describe embodiments of the present invention or solutions of the prior art more clearly, a brief description of the drawings that are referenced in the description of the embodiments or solutions is set forth below. Apparently, these drawings show only some embodiments of the present invention, and one of ordinary skill in the art can obtain from them other drawings showing different embodiments without paying any creative effort. In these figures.

DETAILED DESCRIPTION

In order to facilitate an understanding of the present invention, the invention is described more fully below with reference to the particular embodiments, which represent preferred embodiments for practicing the invention. However, the present invention may be implemented in many different forms and should not be construed as limited to the embodiments set forth herein. Rather, these embodiments are provided so that this disclosure will be thorough and complete.

Unless defined otherwise, all technical and scientific terms used herein have the same meaning as commonly understood by one of ordinary skill in the art to which this disclosure belongs. The terminology used herein is for the purpose of describing particular embodiments only and is not intended to be limiting of this disclosure.

Figure 1:
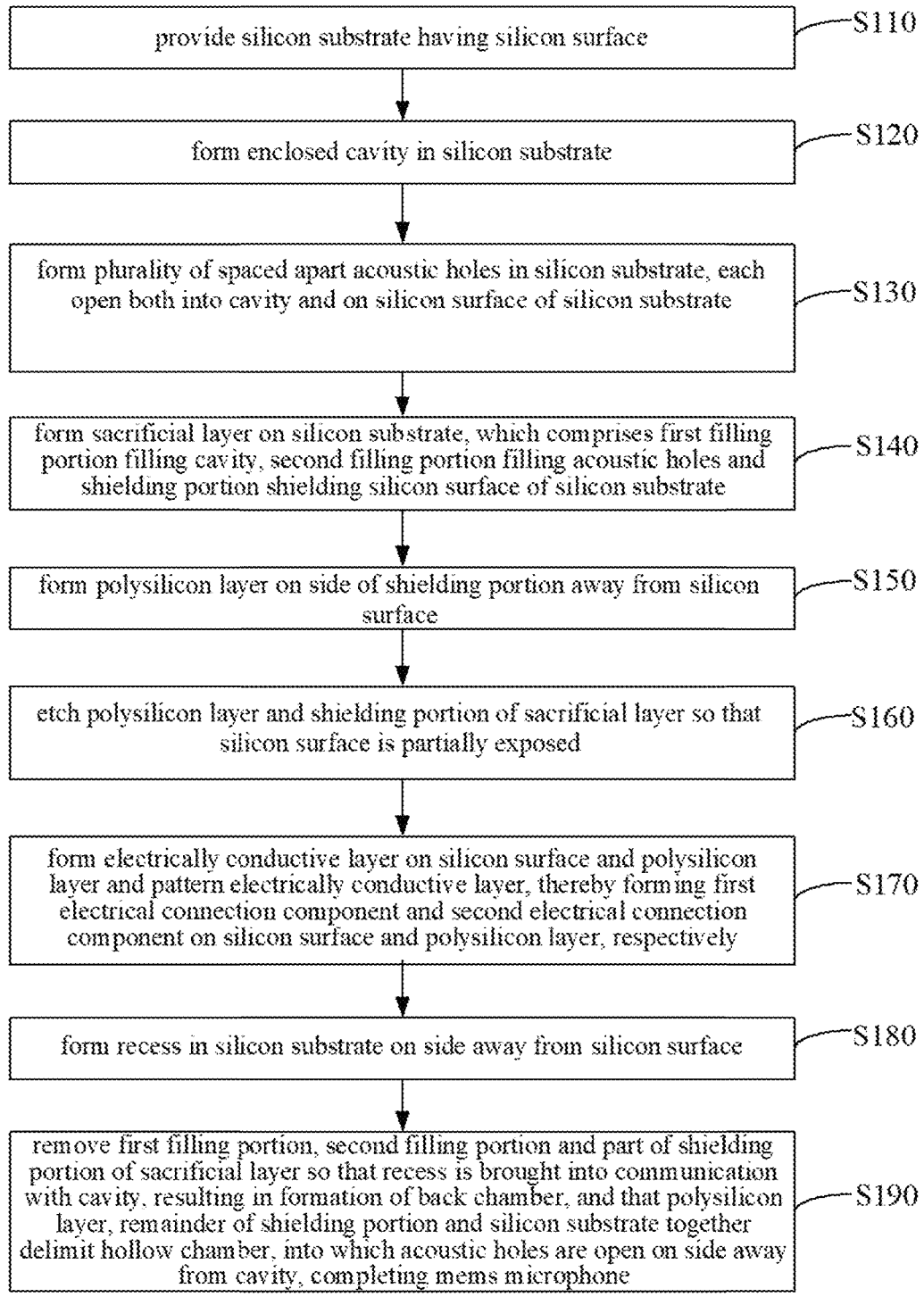
FIG. 1 is a process flowchart of a preparation method for an MEMS microphone according to an embodiment.

Referring to FIG. 1, a preparation method for a microelectromechanical systems (MEMS) microphone according to an embodiment includes steps S110 to S190 below.

In step S110, a silicon substrate having a silicon surface is provided.

Figure 2:
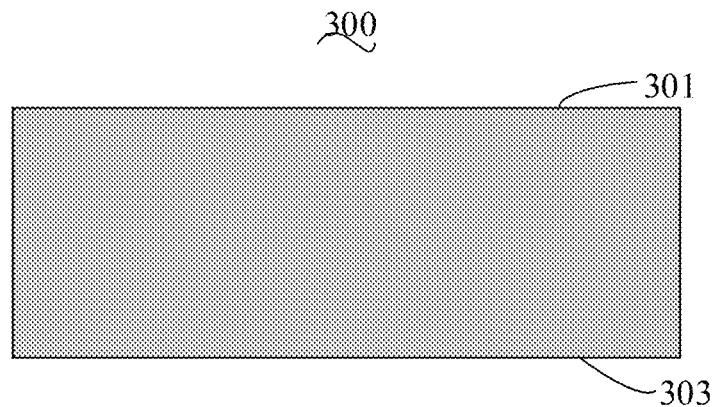
FIG. 2 is a structural schematic of a silicon substrate provided in step S110 in the process flowchart of a preparation method for an MEMS microphone of FIG. 1.

Specifically, referring to FIG. 2, the silicon substrate 300 may have a silicon surface 301 and a backside 303 opposing the silicon surface.

In step S120, an enclosed cavity is formed in the silicon substrate.

Specifically, step S120 may include steps S121 to S122.

In step S121, a deep trench etching process is performed on the silicon substrate from the side close to the silicon surface to form a plurality of spaced apart trenches in the silicon substrate.

Each of the trenches may have a width of 0.1 μm to 1.0 μm and a depth of 1 μm to 10 μm, and the trenches may be formed at an interval of 0.1 μm to 1.0 μm.

Specifically, step S121 may include: depositing a mask layer on the silicon surface; etching and patterning the mask layer; etching the silicon substrate from the side of the mask layer and thus forming the plurality of spaced apart trenches in the silicon substrate; and stripping away the mask layer. The mask layer may be formed of a material commonly used in the art. The deposition of the mask layer and the etching of the mask layer may be accomplished by techniques commonly used in the art and thus further description thereof is omitted herein.

Figure 3:
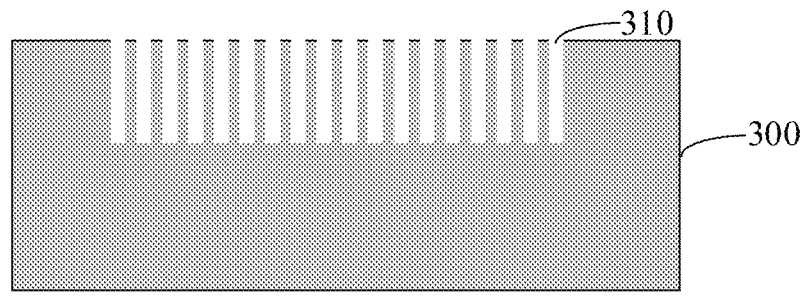
FIG. 3 is a structural schematic of trenches formed in the silicon substrate in step S121 in the process flowchart of a preparation method for an MEMS microphone of FIG. 1.

Referring to FIG. 3, a plurality of trenches 310 are formed in the silicon substrate 300 in step S121, the plurality of trenches 310 are spaced apart and all open on the silicon surface 301.

In Step S122, the silicon substrate is annealed in hydrogen at a high temperature of at least 1000° C. so that the plurality of trenches are filled by silicon atoms from the silicon substrate, resulting in the formation of the enclosure cavity.

Specifically, the high temperature may range from 1000° C. to 1200° C.

Under the action of the high temperature and the hydrogen atmosphere, silicon atoms around the trenches migrate and rearrange themselves, thus filling the plurality of trenches and forming the cavity in the substrate.

Figure 4:
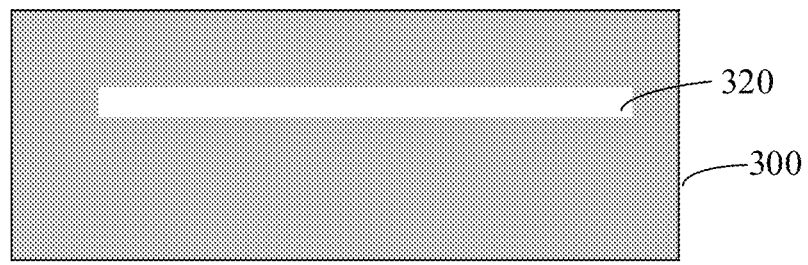
FIG. 4 is a structural schematic of a cavity formed in the silicon substrate in step S122 in the process flowchart of a preparation method for an MEMS microphone of FIG. 1.

FIG. 4 shows the enclosed cavity 320 in the silicon substrate 300 resulting from the deep trench etching process and annealing process.

The silicon surface of the silicon substrate may be spaced from the cavity by a distance of 1 μm to 2 μm. In practice, an epitaxial layer may be optionally formed depending on a required baseplate thickness. For example, if the required baseplate thickness is 3 μm and the distance from the silicon surface of the silicon substrate to the cavity is 1 μm, an epitaxial layer spaced from the cavity by a distance of 3 μm may be formed on the silicon surface. Specifically, the epitaxial layer may be formed on the silicon surface by epitaxial deposition. It is to be noted that if the distance from the silicon surface of the silicon substrate to the cavity satisfies the baseplate thickness requirement, the epitaxial layer may not be formed. Specifically, the baseplate thickness may range from 2 μm to 3 μm.

In the present embodiment, the silicon substrate between the cavity and the silicon surface constitutes the baseplate. That is, in the present embodiment, part of the silicon substrate provides the baseplate, on which a sacrificial layer and a diaphragm are to be formed. In this way, the stack on the silicon substrate is allowed to have a reduced thickness and thus can be more easily handled by photolithography and etching processes.

In step S130, a plurality of spaced apart acoustic holes are formed in silicon substrate, each acoustic hole has two openings, one of which communicates with the cavity, and the other one is located on the silicon surface.

Specifically, step S130 may include: depositing a mask layer on the silicon surface of the silicon substrate; and etching and patterning the mask layer. The etching may be performed on the side of the silicon substrate where the mask layer is formed and result in the formation of the plurality of spaced apart acoustic holes.

Figure 5:
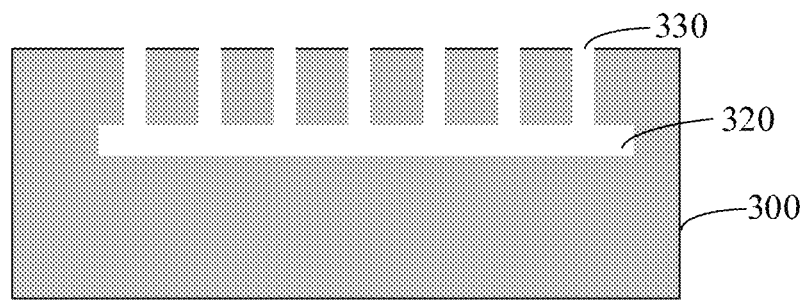
FIG. 5 is a structural schematic of acoustic holes formed in the silicon substrate in step S130 in the process flowchart of a preparation method for an MEMS microphone of FIG. 1.

Referring to FIG. 5, the plurality of acoustic holes 330 may be formed in the silicon substrate in step S130, thus enabling the silicon substrate to provide the baseplate.

In step S140, a sacrificial layer is formed on the silicon substrate, which includes a first filling portion that fills the cavity, a second filling portion that fills the acoustic holes and a shielding portion that shields the silicon surface.

Specifically, the shielding portion may have a thickness of 1 μm to 4 μm.

The formation of the sacrificial layer on the silicon substrate may be accomplished by a technique commonly used in the art, such as at least one of vapor deposition and thermal oxidation.

Figure 6:
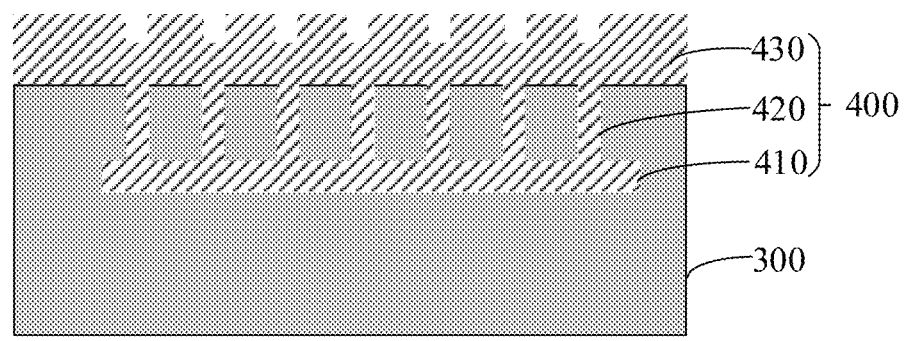
FIG. 6 is a structural schematic of a sacrificial layer filling the acoustic holes in the silicon substrate in step S140 in the process flowchart of a preparation method for an MEMS microphone of FIG. 1.

FIG. 6 shows the sacrificial layer 400 formed in step S140, which includes the first filling portion 410, the second filling portion 420 and the shielding portion 430. Because of the presence of the acoustic holes in the silicon substrate, the resulting sacrificial layer has a pattern made up of recessed grooves aligned with the respective acoustic holes. The sacrificial layer 400 may be partially removed subsequently.

In step S150, a polysilicon layer is formed over the shielding portion on the side away from the silicon surface.

Specifically, the formation of the polysilicon layer may be accomplished by a technique commonly used in the art. The polysilicon layer may have a thickness of 0.2 μm to 1.0 μm.

Figure 7:
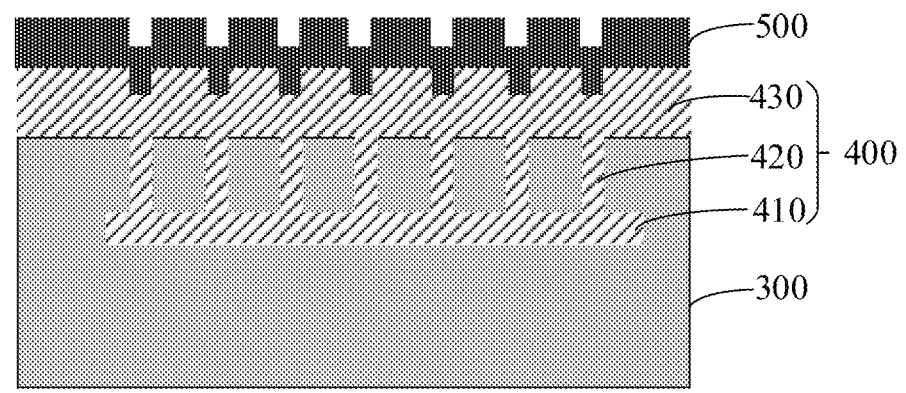
FIG. 7 is a structural schematic of a polysilicon layer formed on the sacrificial layer on the silicon substrate in step S150 in the process flowchart of a preparation method for an MEMS microphone of FIG. 1.

Specifically, referring to FIG. 7, because of the presence of the recessed grooves in the sacrificial layer 400 aligned with the respective acoustic holes, the resulting polysilicon layer 500 also has a pattern made up of recessed grooves, which are in turn aligned with said recessed grooves, and the polysilicon layer 500 can thus serve as a diaphragm of the MEMS microphone.

In step S160, the polysilicon layer and the shielding portion of the sacrificial layer are etched so that the silicon surface is partially exposed.

Figure 8:
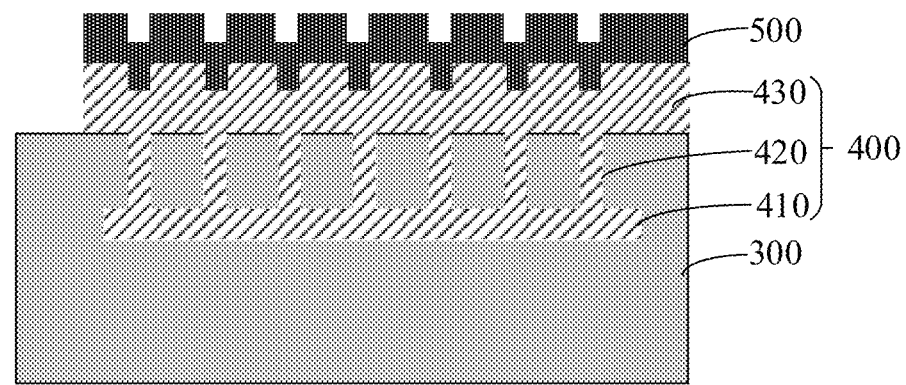
FIG. 8 is a structural schematic of the silicon substrate, the sacrificial layer and the polysilicon layer processed in step S160 in the process flowchart of a preparation method for an MEMS microphone of FIG. 1.

Referring to FIG. 8, a material may be then deposited on the part of the silicon surface exposed as a result of etching the polysilicon layer and the shielding portion of the sacrificial layer to form a first electrical connection component.

In Step S170, an electrically conductive layer is formed over the silicon surface and the polysilicon layer and then patterned to result in the formation of the first electrical connection component and a second electrical connection component respectively on the silicon surface and the polysilicon layer.

Specifically, the electrically conductive layer may be formed of a commonly used metal such as aluminum, gold or the like. The electrically conductive layer may be patterned using a conventional technique such as photolithography or wet etching.

Figure 9:
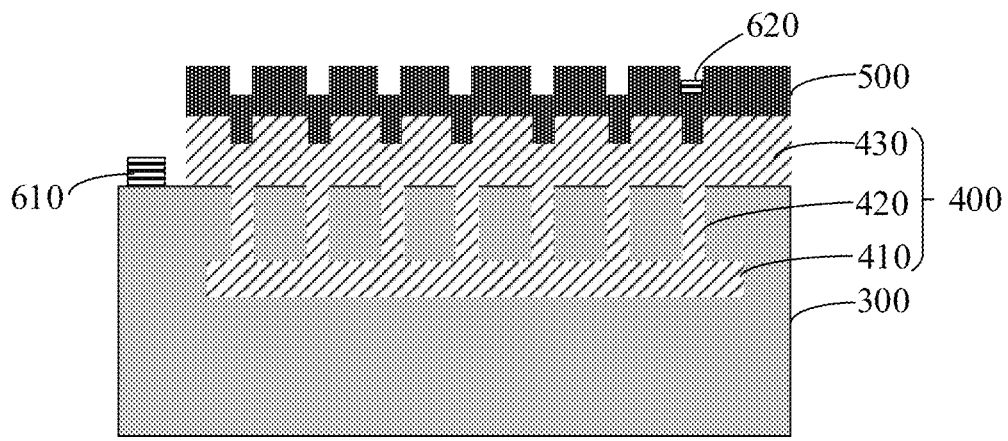
FIG. 9 is a structural schematic of first and second electrical connection components formed on the polysilicon layer and the silicon substrate in step S170 in the process flowchart of a preparation method for an MEMS microphone of FIG. 1.

Referring to FIG. 9, the first electrical connection component 610 and the second electrical connection component 620 are formed on the silicon surface and the polysilicon layer, respectively, resulting from steps S160 and S170, so that the baseplate may be connected to the diaphragm through the first electrical connection component 610 and the second electrical connection component 620.

In Step S180, a recess is formed in the silicon substrate on the side away from the silicon surface.

Specifically, step S180 may include: grinding the silicon substrate on the side away from the silicon surface; and then forming the recess in the silicon substrate by photolithography or etching. The first filling portion of the sacrificial layer may serve as a stop layer for the photolithography or etching process, which ensures that the acoustic holes will not be damaged during the formation of the recess.

Figure 10:
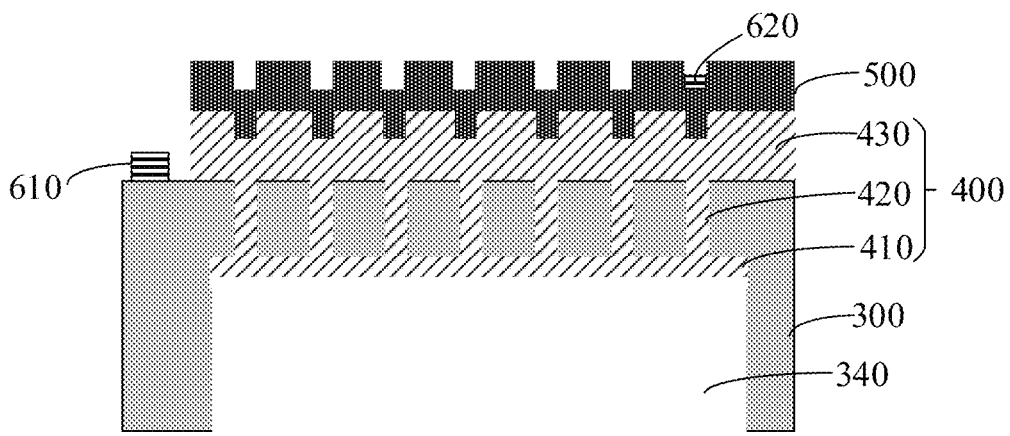
FIG. 10 is a structural schematic of a formed recess, the silicon substrate, the sacrificial layer and the polysilicon layer in step S180 in the process flowchart of a preparation method for an MEMS microphone of FIG. 1.

FIG. 10 shows the recess 340 in the silicon substrate resulting from step S180.

In Step S190, the first filling portion, the second filling portion and part of the shielding portion of the sacrificial layer are removed so that the recess is brought into communication with the cavity, thus forming a back chamber. The polysilicon layer, the remainder of the shielding portion and the silicon substrate together delimit a hollow chamber, into which the acoustic holes are open at the side away from the cavity, thus completing the MEMS microphone.

Specifically, step S190 may include: etching the silicon substrate with a buffered etching solution so as to remove the first filling portion, the second filling portion and part of the shielding portion of the sacrificial layer.

Figure 11:
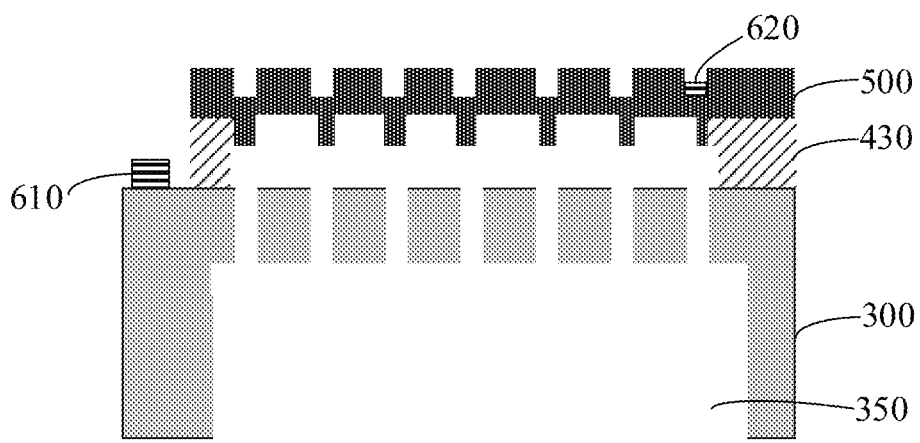
FIG. 11 is a structural schematic of the microphone obtained in step S190 in the process flowchart of a preparation method for an MEMS microphone of FIG. 1.

Referring to FIG. 11, as a result of the partial removal of the sacrificial layer in step S190, the recess is brought into communication with the cavity, thus forming the back chamber 350. At the same time, the acoustic holes are evacuated, and the hollow chamber is present between the baseplate and the diaphragm, completing the MEMS microphone.

Conventional fabrication of an MEMS microphone usually involves successively depositing a polysilicon layer on a silicon substrate, a sacrificial layer on the polysilicon layer and another polysilicon layer on the sacrificial layer. The stack of these layers on the silicon substrate tends to a considerable thickness. Since a photolithography process typically has a lower limit of 2 μm to 3 μm, the relatively large thickness of the stack makes photolithographic processing and etching of each layer challenging.

In contrast, the above method has at least the following advantages:

1) In this preparation method for an MEMS microphone, forming the cavity and the plurality of acoustic holes in the silicon substrate enables the silicon substrate to provide the baseplate. The sacrificial layer formed over the silicon substrate fills the cavity and the acoustic holes and shields the silicon surface. Moreover, since the acoustic holes are filled by part of the sacrificial layer, the sacrificial layer formed on the silicon surface has a certain pattern. As a result, the polysilicon layer formed on the sacrificial layer also has a certain pattern and can thus serve as a diaphragm. At last, the recess is formed in the silicon substrate and the sacrificial layer is partially removed. This brings the recess into communication with the cavity, thereby forming the back chamber. Additionally, the acoustic holes are evacuated, and the polysilicon layer, the remainder of the shielding portion and the silicon substrate together delimit the hollow chamber, thus completing the microphone. In this preparation method for an MEMS microphone, forming the enclosed cavity and the plurality of acoustic holes in the silicon substrate enable part of the silicon substrate to serve as the baseplate, and the sacrificial and polysilicon layers are then stacked on the silicon substrate. Compared with the conventional fabrication which involves successively stacking a first polysilicon layer, a sacrificial layer and another first polysilicon layer over the silicon substrate, this stack on the silicon substrate has a reduced thickness and includes only one first polysilicon layer, thus making the microphone easier to make.

2) Using this preparation method for an MEMS microphone, a thinner stack can be made on the silicon substrate, and therefore for a given required total stack thickness, increased thicknesses of the sacrificial and polysilicon layers are allowed. Thus, the method can be used to produce microphones satisfying various requirements.

An MEMS microphone according to an embodiment includes a silicon substrate, a support member and a polysilicon layer. The silicon substrate has a silicon surface, and a back chamber and a plurality of spaced apart acoustic holes are formed in the silicon substrate. Each of the acoustic holes is open both at the silicon surface and into the back chamber. The support member is arranged on the silicon surface, and the polysilicon layer is disposed on the support member so as to be spaced from the silicon substrate. In this way, the silicon substrate, the support layer and the polysilicon layer together delimit a hollow chamber, into which the acoustic holes are open on the side away from the back chamber.

The MEMS microphone of this embodiment may be fabricated using the above preparation method for an MEMS microphone.

In one embodiment, a first electrical connection component and a second electrical connection component respectively reside on the silicon surface and the polysilicon layer, respectively.

The various technical features of the foregoing embodiments may be combined in any way. Although not all such combinations have been described above for the sake of brevity, any of them is considered to fall within the scope of this specification as long as there is no contradiction between the technical features.

Presented above are merely several embodiments of the present application. Although these embodiments are described with some particularity and in some detail, it should not be construed that they limit the scope of the present application in any sense. Note that various variations and modifications can be made by those of ordinary skill in the art without departing from the concept of the present application. Accordingly, it is intended that all such variations and modifications are embraced within the scope of this application as defined in the appended claims.

What is claimed is:

1. A preparation method for a micro-electromechanical systems (MEMS) microphone, comprising the steps of:
   providing a silicon substrate having a silicon surface;
   forming an enclosed cavity in the silicon substrate;
   forming a plurality of spaced apart acoustic holes in the silicon substrate, each of the plurality of acoustic holes having two openings, one of which communicating with the cavity and the other one located on the silicon surface of the silicon substrate;
   forming a sacrificial layer on the silicon substrate, which comprises a first filling portion filling the cavity, a second filling portion filling the plurality of acoustic holes and a shielding portion shielding the silicon surface of the silicon substrate;
   forming a polysilicon layer on a side of the shielding portion away from the silicon surface;
   forming a recess in the silicon substrate on a side away from the silicon surface; and removing the first filling portion, the second filling portion and part of the shielding portion of the sacrificial layer so that the recess is brought into communication with the cavity, resulting in the formation of a back chamber, and that the polysilicon layer, the remainder of the shielding portion and the silicon substrate together delimit a hollow chamber, the hollow chamber communicating with the opening of the plurality of acoustic holes away from the cavity, completing the MEMS microphone.

2. The preparation method for an MEMS microphone of claim 1, wherein the formation of the enclosed cavity in the silicon substrate comprises:
forming a plurality of spaced apart trenches in the silicon substrate by performing a deep trench etching process on the silicon substrate on the side close to the silicon surface; and
annealing the silicon substrate in hydrogen at a high temperature of at least 1000° C.so that the plurality of trenches are filled by silicon atoms from the silicon substrate, thus forming the cavity in the silicon substrate.

3. The preparation method for an MEMS microphone of claim 2, wherein each of the plurality of trenches has a width of 0.1 μm to 1.0 μm and a depth of 1 μm to 10 μm, and the plurality of trenches are formed at an interval of 0.1 μm to 1.0 μm.

4. The preparation method for an MEMS microphone of claim 2, wherein the deep trench etching process performed on the silicon substrate on the side close to the silicon surface comprises: depositing a mask layer on the silicon surface; etching and patterning the mask layer; further etching the silicon substrate on the side with the mask layer and thus forming the plurality of spaced apart trenches in the silicon substrate; and stripping away the mask layer.

5. The preparation method for an MEMS microphone of claim 2, wherein all the plurality of trenches are open on the silicon surface.

6. The preparation method for an MEMS microphone of claim 2, wherein the high temperature ranges from 1000° C. to 1200° C.

7. The preparation method for an MEMS microphone of claim 1, wherein the silicon surface of the silicon substrate is spaced from the cavity by a distance of 1 μm to 2 μm.

8. The preparation method for an MEMS microphone of claim 1, further comprising: forming an epitaxial layer on the silicon surface by epitaxial deposition, subsequent to the formation of the enclosed cavity in the silicon substrate and prior to the formation of the plurality of acoustic holes in the silicon substrate; and during the formation of the plurality of spaced apart acoustic holes in the silicon substrate, forming a plurality of through holes in the epitaxial layer, each in communication with a respective one of the plurality of acoustic holes.

9. The preparation method for an MEMS microphone of claim 1, wherein the formation of the plurality of spaced apart acoustic holes in the silicon substrate comprises:
depositing a mask layer on the silicon surface of the silicon substrate; etching and patterning the mask layer; and further etching the silicon substrate on the side with the mask layer, thus forming the plurality of spaced apart acoustic holes in the silicon substrate.

10. The preparation method for an MEMS microphone of claim 1, further comprising, subsequent to the formation of the polysilicon layer on the side of the shielding portion away from the silicon surface and prior to the formation of the recess in the silicon substrate on the side away from the silicon surface,
etching the polysilicon layer and the shielding portion of the sacrificial layer so that the silicon surface is partially exposed; and
forming an electrically conductive layer on the silicon surface and the polysilicon layer and patterning the electrically conductive layer, thereby forming a first electrical connection component and a second electrical connection component on the silicon surface and the polysilicon layer, respectively.

11. The preparation method for an MEMS microphone of claim 10, wherein the electrically conductive layer is patterned by photolithography or wet etching.

12. The preparation method for an MEMS microphone of claim 10, wherein the electrically conductive layer is made of aluminum or gold.

13. The preparation method for an MEMS microphone of claim 1, wherein the formation of the sacrificial layer on the silicon substrate is accomplished by at least one of thermal oxidation and vapor deposition.

14. The preparation method for an MEMS microphone of claim 1, wherein the shielding portion has a thickness of 1 μm to 4 μm.

15. The preparation method for an MEMS microphone of claim 1, wherein the polysilicon layer has a thickness of 0.2 μm to 1.0 μm.

16. The preparation method for an MEMS microphone of claim 1, wherein the formation of the recess in the silicon substrate on the side away from the silicon surface comprises: grinding the silicon substrate from the side away from the silicon surface; and forming the recess in the silicon substrate by photolithography or etching.

17. The preparation method for an MEMS microphone of claim 1, wherein the removal of the first filling portion, the second filling portion and part of the shielding portion of the sacrificial layer is accomplished by an etching process performed over the silicon substrate using a buffered etching solution.

18. A micro-electromechanical systems (MEMS) microphone comprising a silicon substrate, a support member and a polysilicon layer, the silicon substrate having a silicon surface, the silicon substrate formed therein with a back chamber and a plurality of spaced apart acoustic holes, each of the plurality of acoustic holes having two openings, one of which located on the silicon surface of the silicon substrate and the other one communicating with the back chamber, the support member arranged on the silicon surface, the polysilicon layer disposed on the support member so as to be spaced apart from the silicon substrate so that the silicon substrate, the support member and the polysilicon layer together delimit a hollow chamber, the hollow chamber communicating with the opening of the plurality of acoustic holes away from the back chamber,
wherein the MEMS microphone is fabricated by the steps of:
providing the silicon substrate having the silicon surface;
forming an enclosed cavity in the silicon substrate;
forming the plurality of spaced apart acoustic holes in the silicon substrate, each of the plurality of acoustic holes having two openings, one of which communicating with the cavity and the other one located on the silicon surface of the silicon substrate;
forming a sacrificial layer on the silicon substrate, which comprises a first filling portion filling the cavity, a second filling portion filling the plurality of acoustic holes and a shielding portion shielding the silicon surface of the silicon substrate;

forming the polysilicon layer on a side of the shielding portion away from the silicon surface;

forming a recess in the silicon substrate on a side away from the silicon surface; and removing the first filling portion, the second filling portion and part of the shielding portion of the sacrificial layer, so that the support member is formed, that the recess is brought into communication with the cavity, resulting in the formation of the back chamber, and that the polysilicon layer, the remainder of the shielding portion and the silicon substrate together delimit the hollow chamber, the hollow chamber communicating with the opening of the plurality of acoustic holes away from the cavity, completing the MEMS microphone.

19. The MEMS microphone of claim 18, further comprising a first electrical connection component and a second electrical connection component on the silicon surface and the polysilicon layer, respectively.

* * * * *